United States Patent
Lee et al.

(10) Patent No.: US 9,009,559 B2
(45) Date of Patent: Apr. 14, 2015

(54) METHOD AND APPARATUS FOR WIRELESS DATA TRANSMISSION SUBJECT TO PERIODIC SIGNAL BLOCKAGES

(75) Inventors: Lin-Nan Lee, Potomac, MD (US); Mustafa Eroz, Germantown, MD (US); Liping Chen, Bethesda, MD (US); Satyajit Roy, Gaithersburg, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 205 days.

(21) Appl. No.: 13/422,534

(22) Filed: Mar. 16, 2012

(65) Prior Publication Data

US 2013/0246884 A1 Sep. 19, 2013

(51) Int. Cl.
*H03M 13/00* (2006.01)
*H04L 1/00* (2006.01)
*H03M 13/27* (2006.01)
*H03M 13/29* (2006.01)
*H03M 13/25* (2006.01)

(52) U.S. Cl.
CPC ............ *H04L 1/0041* (2013.01); *H04L 1/0061* (2013.01); *H03M 13/27* (2013.01); *H04L 1/0071* (2013.01); *H04L 1/0057* (2013.01); *H04L 1/004* (2013.01); *H03M 13/2936* (2013.01); *H03M 13/29* (2013.01); *H03M 13/25* (2013.01); *H03M 13/6561* (2013.01)

(58) Field of Classification Search
CPC ... H04L 1/0041; H04L 1/0071; H04L 1/0057; H04L 1/0061; H04L 1/004; H03M 13/27; H03M 13/2936; H03M 13/29; H03M 13/6561; H03M 13/25; H03M 13/151
USPC .................................................. 714/755, 758
See application file for complete search history.

(56) References Cited

U.S. PATENT DOCUMENTS

| | | | | |
|---|---|---|---|---|
| 5,835,165 | A  * | 11/1998 | Keate et al. ............. | 375/240.27 |
| 5,912,902 | A  * | 6/1999 | Monroe ........................ | 714/746 |
| 6,202,189 | B1 * | 3/2001 | Hinedi et al. ................. | 714/786 |
| 6,229,824 | B1 * | 5/2001 | Marko .......................... | 370/477 |
| 6,697,985 | B1 * | 2/2004 | Ilani ............................. | 714/751 |
| 7,134,065 | B2 * | 11/2006 | McIntire et al. .............. | 714/762 |
| 7,298,696 | B1 * | 11/2007 | Wu ............................... | 370/229 |
| 8,261,164 | B2 * | 9/2012 | Nebat ........................... | 714/785 |
| 8,413,012 | B2 * | 4/2013 | Limberg ....................... | 714/758 |
| 8,437,406 | B2 * | 5/2013 | Kolze et al. .............. | 375/240.24 |

* cited by examiner

*Primary Examiner* — James C Kerveros
(74) *Attorney, Agent, or Firm* — Potomac Technology Law, LLC

(57) ABSTRACT

A system and method for data transmissions in a wireless communications system, which accommodates for a periodic blockage of the transmission signal, is provided. A data stream is segmented into packets of a predetermined fixed-size for a burst-mode transmission over a channel of the communications system, wherein the transmission is subject to a periodic blockage. A forward error correction outer code is then applied to the packets of the data stream for recovery of packets subjected to the periodic blockage, and a unique word is added to each packet for acquisition of frequency, carrier phase and symbol timing of the respective packet. The packets of the data stream are interleaved based on an interleaver of a depth based at least in part on a ratio of a blockage free duration between two consecutive blockages of the periodic blockage to a duration of each blockage of the periodic blockage.

33 Claims, 10 Drawing Sheets

METHOD AND APPARATUS FOR WIRELESS DATA TRANSMISSION SUBJECT TO PERIODIC SIGNAL BLOCKAGES

FIELD

The present invention relates to data transmission in a satellite communications system, and more specifically to data transmission in a satellite communications system, where the data transmission is subject to periodic short duration blockages of the transmission signal to and from the satellite terminal.

BACKGROUND

Modern satellite communication systems provide a pervasive and reliable infrastructure to distribute voice, data, and video signals for global exchange and broadcast of information. Such satellite communication systems also have emerged as infrastructure networks for data communications and entertainment services on-board aircraft. For example, satellite communications networks are now used for broadband services (e.g., Internet access and e-mail and other messaging services) and entertainment (e.g., satellite television and video streaming services) aboard commercial airliners. Further, satellite communications are increasingly used for data communications in other aircraft applications, such as government aircraft applications (e.g., military and first responder aircraft applications), including helicopters.

Additionally, in communications systems, system performance may be aided by employing forward error correction (FEC) or channel coding. Moreover, nearly all such satellite communications systems rely on some form of error control coding for managing errors that may occur due to noise and other factors during transmission of information through the satellite communication channel. Efficient error control schemes implemented at the transmitting end of these communications systems have the capacity to enable the transmission of data (e.g., audio, video, text, etc.) with very low error rates within a given signal-to-noise ratio (SNR) environment. Powerful error control schemes also enable a communications system to achieve target error performance rates in environments with very low SNR, such as in satellite and other wireless systems, where noise is prevalent and high levels of transmission power are costly. More powerful error control schemes, however, result in more complex and costly implementations, if even feasible. Further, in addition to FEC coding, satellite communications systems typically also employ interleaving to improve the performance of the FEC coding.

With respect to helicopters, however, due to physical constraints of helicopter airframes, the signal path between the satellite and the satellite antenna is blocked by the rotary wings, also known as the blades. The period between blockages generally depends on the aircraft design. The duration of the blockages are of a relatively short period of time, depends on a number of parameters, including the width of the blades, the distance between the rotor and the antenna, the azimuth and elevation angle of the satellite, as well as the clearance height between the antenna and the blades. Additionally, the speed of the rotor affects both the periods between blockages and the duration of the blockage. Typically, thermal noise, with Doppler if on a mobile platform, produces the main impairment experienced over the channel for satellite transmissions via a tracking antenna with high directivity. For helicopter-mounted antennas, however, the blockage of the blades adds an additional impairment that dominates transmission performance, overshadowing the effects of thermal noise. Also, multi-paths generated by reflection from the nearest blades and aircraft body can also be an issue, but is generally secondary for highly directed antennas at Ku and Ka band frequencies. The periodic blockage of the blades generally creates two problems. First, receiver synchronization is disrupted by the signal interruption, which can result in loss of synchronization. Loss of synchronization then requires execution of a search and synchronization algorithm to reestablish synchronization. Further, if the next blade blockage occurs prior to reestablishing synchronization, the synchronization algorithm may be further disrupted and/or delayed. Second, data packets or frames transmitted during the period of a blockage is either completely lost or severely attenuated. Accordingly, at the time a blockage begins, and during the duration of the blockage, one or more transmitted data packets will be partially cut-off and/or entirely blocked.

Two prior alternatives are known for addressing such periodic blockage by helicopter blades. A first of these alternatives is to synchronize the data transmissions with the blade rotation. This approach is potentially possible for the return link by monitoring the forward link signal strength to determine the presence of a clear path—that is, if the forward link signal is always transmitted. A problem with this approach is that a latency is involved, and the transmission must be completed before the blockage by the next blade occurs. It is not practical, however, for the network hub to track the blade position of a helicopter on the forward link. Also, with this approach, it is impossible for multiple helicopters to share a single forward link carrier simultaneously, because it is not possible to synchronize individual transmissions to each helicopter, as their blades positions are not synchronized. This technique, therefore, is only useful for the helicopter to hub, or return link, transmissions. The second alternative recovers blocked information through retransmission. Common automatic repeat request (ARQ) retransmission, however, will not work properly, because the blockage can cause an error rate much higher than what is normally expected for ARQ systems to work. Further, the latency for reliable information delivery can be very long due to high retransmission rates. Furthermore, because acknowledgements and repeat requests from the receiving end also have the same blockage issue, a special protocol design taking into account the periodic blockage in both directions is required. A variation of the ARQ technique is to simply repeat the transmission about one half of the blockage period later. In this way, at least one of the data transmissions is assured not to be blocked, but this approach also requires duplicate detection at the receive end to properly reassemble the data stream. Moreover, with this approach, throughput is reduced by less than half, wasting significant bandwidth.

What is needed, therefore, is a system and method for data transmissions in a satellite communications system, which accommodates for a periodic short duration blockage of the transmission signal to and from a satellite terminal, without packet loss due to the transmission blockages, while employing a relatively simple FEC data recovery scheme.

SOME EXEMPLARY EMBODIMENTS

The present invention advantageously addresses the foregoing requirements and needs, as well as others, by providing an apparatus and method for data transmissions in a satellite communications system, which accommodates for a periodic short duration blockage of the transmission signal to and from a satellite terminal, without packet loss due to the transmission blockages, while employing a relatively simple FEC data recovery scheme.

According to an exemplary embodiment, a method for data transmissions in a wireless communications system, which accommodates for a periodic short duration blockage of the transmission signal comprises segmenting a first data stream into packets of a predetermined fixed-size for a burst-mode transmission over a wireless channel, wherein the transmission is subject to a first periodic blockage. The method further comprises applying a forward error correction code (FEC) to the packets of the first data stream for recovery of packets subjected to the first periodic blockage. The first data stream is then transmitted over the wireless channel. According to another exemplary embodiment, a unique word (UW) is added to each of the packets of the first data stream for acquisition one or more of a frequency, carrier phase and symbol timing of the respective packet. According to a further exemplary embodiment, the packets of the first data stream are interleaved based on an interleaver of a depth based at least in part on a ratio of a blockage free duration between two consecutive blockages of the first periodic blockage to a duration of each blockage of the first periodic blockage.

According to another exemplary embodiment, an apparatus for data transmissions in a wireless communications system, which accommodates for a periodic short duration blockage of the transmission signal comprises at least one processor and at least one memory including computer program code for one or more programs, where the at least one memory and the computer program code configured to, with the at least one processor, cause the apparatus to perform at least the following. Segmenting a first data stream into packets of a predetermined fixed-size for a burst-mode transmission over a wireless channel, wherein the transmission is subject to a first periodic blockage. Applying a forward error correction code (FEC) to the packets of the first data stream for recovery of packets subjected to the first periodic blockage. The apparatus is then caused to transmit the first data stream over the wireless channel. According to another exemplary embodiment, the apparatus is further caused to add a unique word (UW) to each of the packets of the first data stream for acquisition one or more of a frequency, carrier phase and symbol timing of the respective packet. According to a further exemplary embodiment, the apparatus is further caused to interleave the packets of the data stream based on an interleaver of a depth based at least in part on a ratio of a blockage free duration between two consecutive blockages of the first periodic blockage to a duration of each blockage of the first periodic blockage.

According to a further exemplary embodiment, a data transmissions in a wireless communications system, which accommodates for a periodic short duration blockage of the transmission signal, is implemented via a computer-readable storage medium, carrying one or more sequences of one or more instructions, which, when executed by one or more processors, cause an apparatus to at least perform the following steps. Segmenting a first data stream into packets of a predetermined fixed-size for a burst-mode transmission over a wireless channel, wherein the transmission is subject to a first periodic blockage. Applying a forward error correction code (FEC) to the packets of the first data stream for recovery of packets subjected to the first periodic blockage. Adding a unique word (UW) to each of the packets of the first data stream for acquisition one or more of a frequency, carrier phase and symbol timing of the respective packet and interleaving the packets of the first data stream. The apparatus then transmits the first data stream over the wireless channel.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

A system and method for data transmissions in a satellite communications system, which accommodates for a periodic short duration blockage of the transmission signal to and from a satellite terminal, without packet loss due to the transmission blockages, while employing a relatively simple FEC data recovery scheme, is described. In the following description, for the purposes of explanation, numerous specific details are set forth in order to provide a thorough understanding of the invention. It is apparent, however, that the invention may be practiced without these specific details or with an equivalent arrangement. In other instances, well known structures and devices are shown in block diagram form in order to avoid unnecessarily obscuring the invention.

Figure 1A:
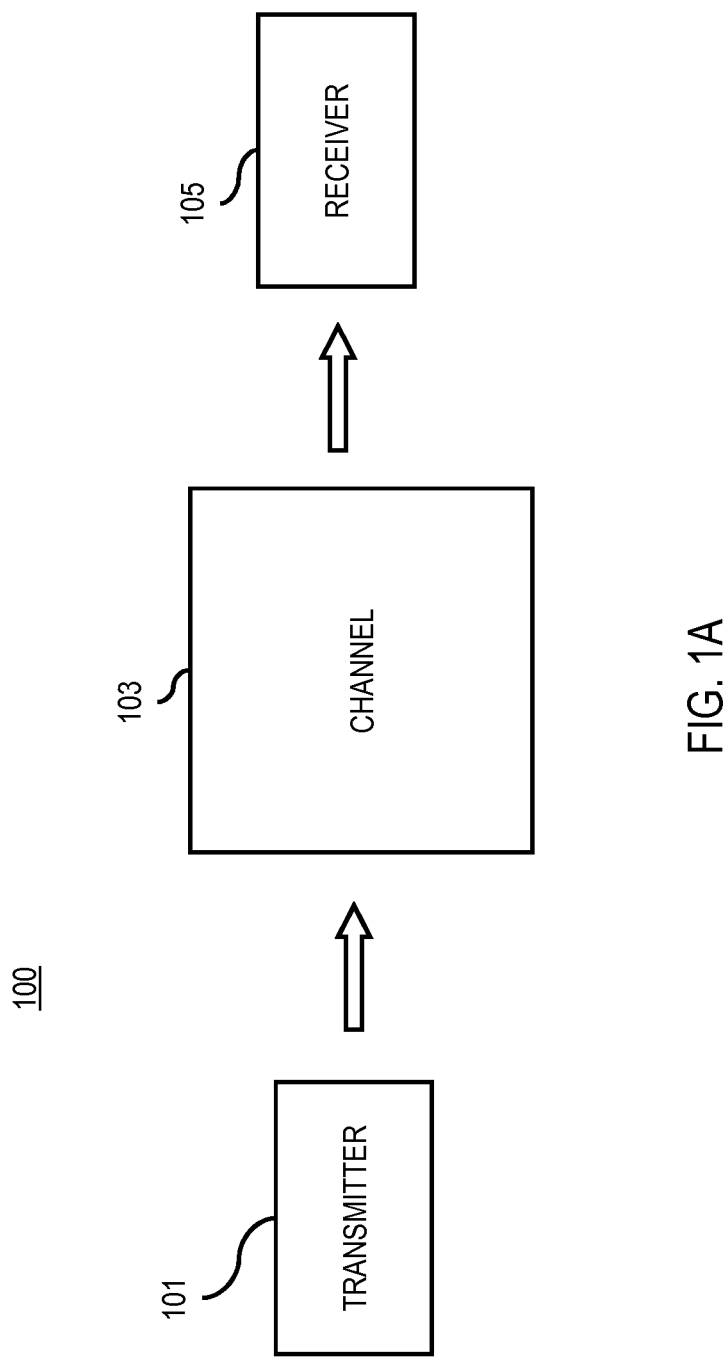
FIGS. 1A and 1B illustrate communications systems capable of employing data transmission that accommodates for a periodic short duration blockage of the transmission signal to and from the communications terminal, in accordance with exemplary embodiments.
Figure 1B:
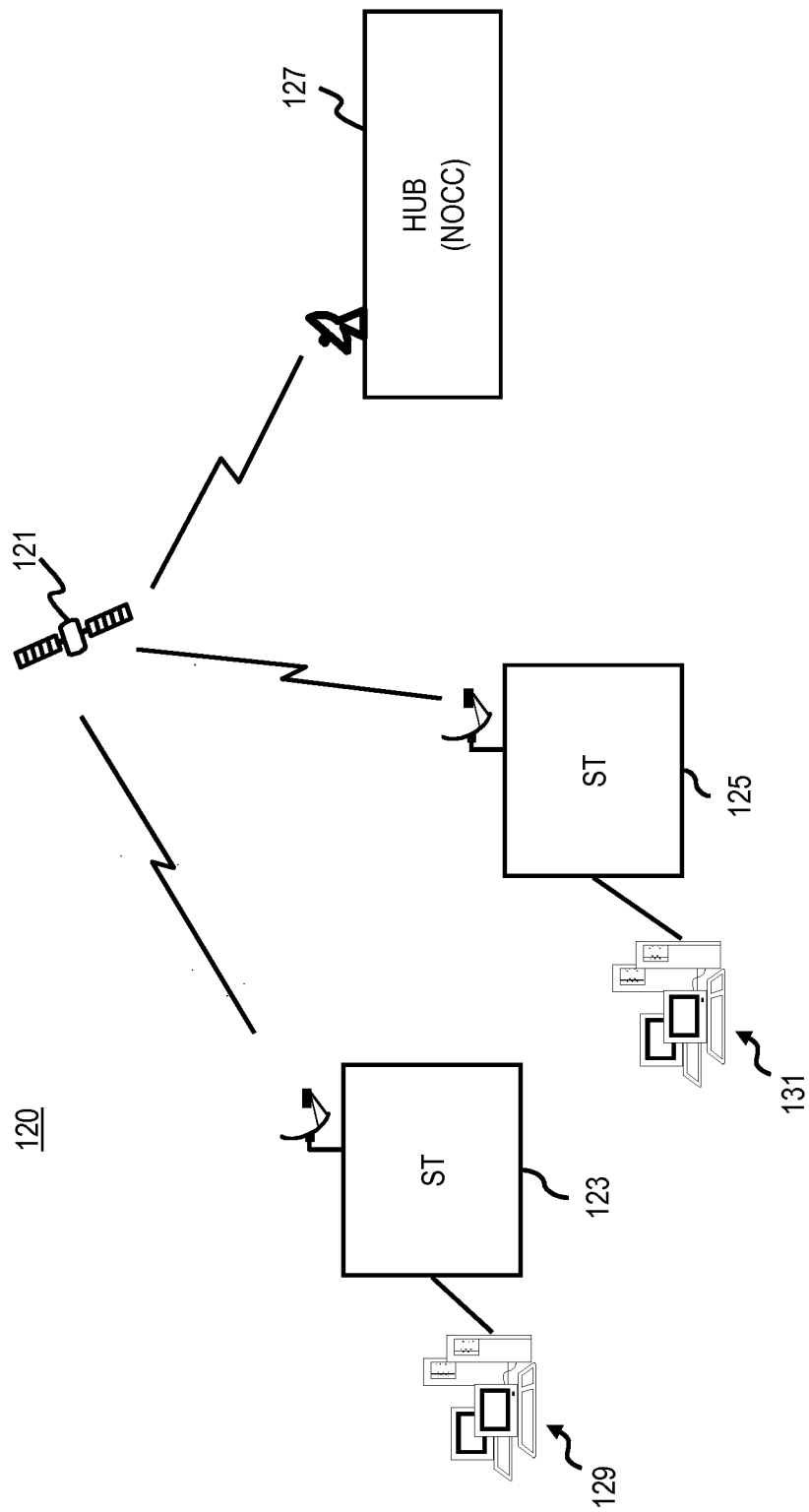

FIGS. 1A and 1B illustrate communications systems capable of utilizing data transmissions that accommodate for a periodic short duration blockage of the transmission signal to and from the satellite terminal, according to various exemplary embodiments of the present invention. A digital communications system 110 includes one or more transmitters 111 (of which one is shown) that generate signal waveforms across a communication channel 113 to one or more receivers 115 (of which one is shown). In this discrete communications system 110, the transmitter 111 has a message source that produces a discrete set of possible messages, where each of the possible messages has a corresponding signal waveform. These signal waveforms are attenuated, or otherwise altered, by communications channel 113. To combat the noise channel 113, coding is utilized. For example, forward error correction (FEC) codes can be employed.

FEC is desired in terrestrial and satellite systems to provide high quality communication over a radio frequency (RF) propagation channel, which induces signal waveform and spectrum distortions, including signal attenuation (freespace propagation loss), multi-path induced fading and adjacent channel interference. These impairments drive the design of the radio transmission and receiver equipment; exemplary design objectives include selecting modulation formats, error control schemes, demodulation and decoding techniques and hardware components that together provide an efficient balance between system performance and implementation complexity. Differences in propagation channel characteristics, such as between terrestrial and satellite communication channels, naturally result in significantly different system designs. Likewise, existing communications systems continue to evolve in order to satisfy increased system requirements for new higher rate or higher fidelity communication services.

FIG. 1B is a diagram of an exemplary satellite communications system 120 capable of supporting communication among terminals with varied capabilities, according to an embodiment of the present invention.

Satellite communications system 120 includes a satellite 121 that supports communication among multiple satellite terminals (STs) 123, 125 and a hub 127. The HUB 127 may assume the role of a Network Operations Center (NOC), which controls the access of the STs 123, 125 to the system 120 and also provides element management functions and control of the address resolution and resource management functionality. The Satellite communications system 120 may operate as a traditional bent-pipe system, where the satellite essentially operates as a repeater. Alternatively, the system 120 may employ a switching or processing satellite supporting mesh communications (point-to-point communications directly between, for example, the two STs 123 and 125). The STs 123, 125 provide connectivity to one or more hosts 129, 131, respectively. The hosts 129, 131 may comprise various types of data communications-based equipment depending upon the particular application.

In a traditional bent-pipe system of an exemplary embodiment, the satellite operates as a repeater or bent pipe, and communications between the STs 123 and 125 are transmitted over a double-hop path. For example, in a communication from ST 123 to ST 125, over the first hop, the communication is transmitted, via the satellite, from the ST 123 to the HUB 127. The HUB 127 decodes the communication and determines the destination ST 125. The HUB 127 then appropriately addresses and repackages the communication, encodes and modulates it, and transmits the communication over the second hop, via the satellite, to the destination ST 125. Accordingly, the satellite of such a system acts as a bent pipe or repeater, transmitting communications between the HUB 127 and the STs.

In an alternate embodiment, with a communications system 120 that employs a processing satellite (e.g., including a packet switch operating, for example, at a data link layer), the system may support direct unicast (point-to-point) communications and multicast communications among the STs 123, 125. In the case of a processing satellite, the satellite 121 decodes the received signal and determines the destination ST or STs (as the hub 127 would in a bent-pipe system). The satellite 121 then addresses the data accordingly, encodes and modulates it, and transmits the modulated signal, over the channel 113, to the destination ST or STs (e.g., ST 125) According to one embodiment of the present invention, the system 120 has a fully meshed architecture, whereby the STs 123, 125 may directly communicate.

Figure 2:
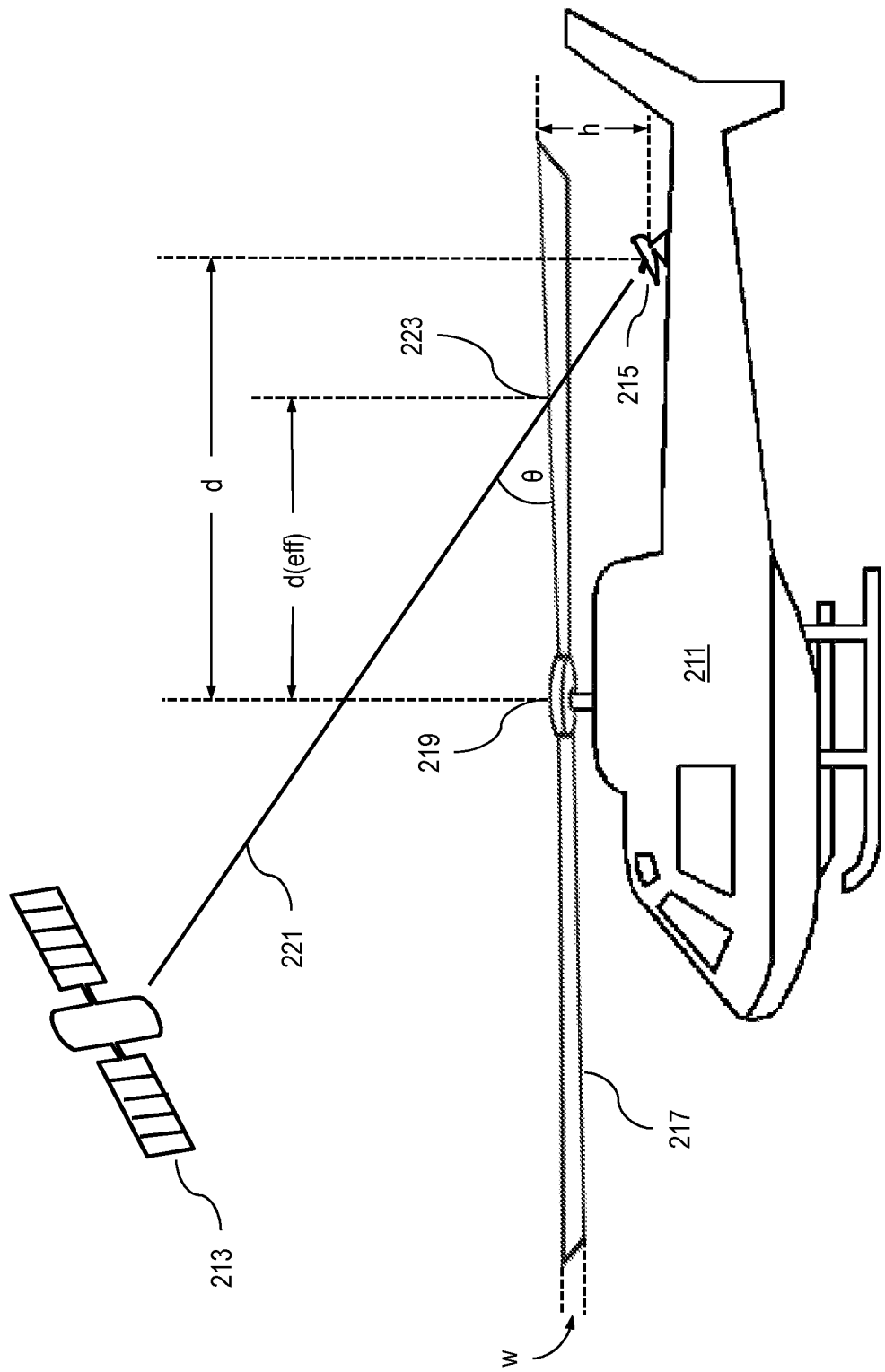
FIG. 2 illustrates various parameters that affect the period and duration of the transmission signal blockage for a satellite terminal antenna mounted on the body of a helicopter, according to an exemplary embodiment.

FIG. 2 illustrates various parameters that affect the period and duration of the transmission signal blockage for a satellite terminal antenna mounted on the body of a helicopter 211, according to an exemplary embodiment. As mentioned above, due to physical constraints of helicopter airframes, such as the helicopter 211, the transmissions between the satellite 213 and the satellite antenna 215 is blocked by the blades 217 of the helicopter. The period between blockages generally depends on the aircraft design. The duration of each blockage is of a relatively short period of time, and depends on a number of parameters. Such parameters include the width of the blades 217 ($w$), the distance between the rotor 219 and the antenna 215 ($d$), the azimuth and elevation angle of the satellite 213 ($\theta$), as well as the clearance height between the antenna 215 and the blades 217 ($h$). Additionally, the speed of the rotor affects both the periods between blockages and the duration of the blockage. The effective distance (d(eff)) between the rotor 219 and the point 223 the satellite signal 221 intersects with the blades 217, and the width of the blade at that point determine the fraction of time during each period the signal 221 will be blocked.

Figure 3A:
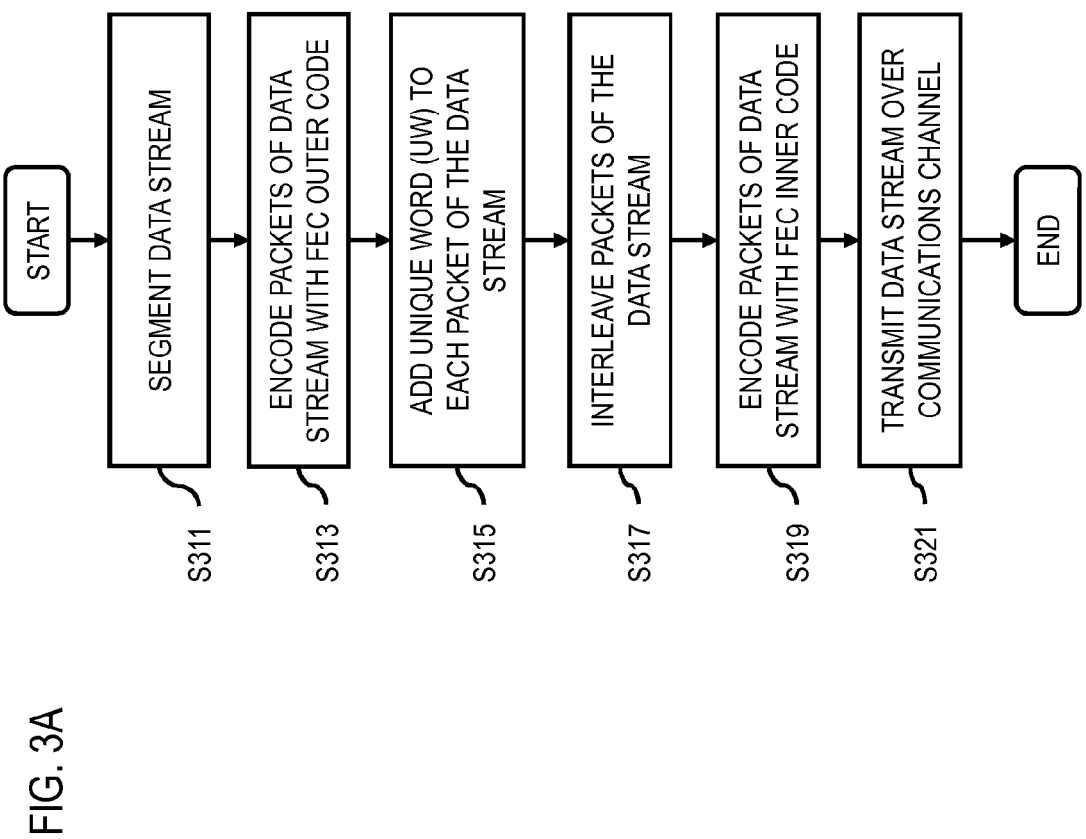
FIG. 3A illustrates a flow chart depicting the process of a data transmission in a wireless communications system, according to an exemplary embodiment.

Referring to FIG. 3A, according to an exemplary embodiment, the transmission of the satellite terminal 123 (for example) is configured as a burst-mode transmission, whereby the data stream is segmented into fixed size datagrams or packets (S311). Accordingly, even though the transmission may be from a single transmitter, instead of a continuous mode demodulator 227, the receiver utilizes a coherent burst demodulation technique, such as techniques typically used for Time Division Multiple Access (TDMA) systems. Unlike common TDMA transmission systems, however, in the cases where the packets are transmitted from a single helicopter, no idle time is needed between the packets. Alternatively, in cases of time multiplexing of data streams from more than one helicopter, the insertion of an idle time between each packet would be required to provide sufficient guard time between transmission bursts from different helicopters.

The packets must be of a size reflecting a fraction of the transmission duration that is free of any blockage from the blades 217. If the size of a packet is larger than the blockage-free duration of transmissions, then every packet will be partially blocked or attenuated. With respect to the duration of the blockage from a blade, there is a tradeoff between packet size and data loss. For increased efficiency, the packet should also be of a size smaller than the duration of the blockage. A tradeoff, however, arises with respect to the packet size. Where the packet size is smaller than the blockage duration, because the packets and the blades are not synchronized, a blade will generally block two packets partially, with possibly one or more completely blocked packets between the two partially blocked packets. Accordingly, longer packets effectively cause increased data loss, because a partially blocked packet is treated in the same manner as a fully blocked packet. On the other hand, while a very short packet size would reduce this loss in efficiency, each packet introduces overhead (e.g., UW and header processing) and inefficiencies resulting therefrom. Accordingly, the overhead can become significant for small packets. According to one exemplary embodiment, the preferred packet size is about half of the blockage duration or somewhat larger, but no more than the blockage duration. With a packet size of half the blockage duration, for example, for a blockage free duration to blockage duration ratio of n:1, generally n−1 packets out of n+1 can be expected to be transmitted without being subject to a blockage. For example, according to an exemplary satellite terminal antenna installation on a helicopter, with a reasonable satellite angle, the ratio is about 9:1, whereby 8 out of 10 packets could be successfully transmitted during a blockage free duration.

Once the packet size is selected to optimize efficiency of the transmission, an outer forward error correction (FEC) coding is applied to ensure that a data stream has been transmitted uninterrupted and to facilitate recovery of packets that have been subject to the periodic blockage (S313). The employment of such an outer FEC code, however, does not affect the more powerful inner FEC coding applied for other channel issues such as thermal noise, fading, adjacent channel interference, etc. For example, such inner codes may comprise convolutional codes, low density parity check (LDPC) codes, or turbo codes. For example, turbo coding represents an iterated soft-decoding scheme that combines two or more relatively simple convolutional codes and an interleaver to produce a block code that can perform to within a fraction of a decibel of the theoretical bound (Shannon limit). LDPC codes represent a class of linear block codes constructed based on a sparse parity-check matrix. Both LDPC codes as well as some classes of turbo codes have been successfully demonstrated to approach near the theoretical bound.

According to one exemplary embodiment, for the outer code, a checksum packet is employed as the basic FEC building block. A checksum packet, for example, is formed by performing exclusive-OR summation over a number of packets (m). In other words, the first bit of each of the m packets are binary added together to form the first bit of the checksum packet, the second bit of each of the m packets are binary added together to form the first bit of the checksum packet, etc., all the way up to the m-th bit of each of the m packets being binary added together to form the m-th bit of the checksum packet. The checksum packet is transmitted as the m+1-th packet. Such an FEC code has a code rate of m/m+1. When any one of the m information packets is damaged, it is detected by its own cyclic parity check or cyclic redundancy check (CRC) code. The damaged packet can then be recovered through an exclusive-OR operation of the other m−1 packets with the checksum packet. Accordingly, the checksum packet can only recover one blocked packet within the set of m packets.

Further, a unique word (UW) is added at the beginning of each packet (S315). In addition to signaling the beginning of a packet, the UW also serves as a synchronization pattern for the burst demodulator to acquire the frequency, carrier phase, and symbol timing for the respective packet. The receiver acquisition method is thus on a burst-by-burst basis, where, provided the UW is successfully obtained, the data packet should be readily attainable. Moreover, even where a packet is attenuated to the point where the UW or part of the burst is unattainable, subsequent bursts will be clear and then (based on the FEC coding) the lost or attenuated burst can be recovered. Accordingly, neither the transmitter nor the receiver is required to know or track the position of the helicopter blades. Provided that the burst or packet size and the interleaver length are optimized for the system parameters, in the case of either fully or partially blocked packets, the FEC coding will facilitate recovery of such blocked packets.

As discussed above, however, the checksum packet can only recover one blocked packet within the set of m packets. As also discussed above, however, more than one packet is affected by the duration of a blockage, and thus, because the checksum packet can only recover one blocked packet, interleaving must be introduced to ensure only one blocked packet is included in the group of m packets reflected by each checksum packet. Accordingly, the packets of the data stream are interleaved based on a predetermined interleaver (S317), where the number of packets (m) is based on the required depth of the interleaver. In other words, if the number of erroneous packets covered by the checksum packet exceeds the error recovery capabilities of the FEC coding, then the system will be unable to recover the lost packets. Interleaving circumvents or diminishes the effects of this problem by shuffling packets across several frames, thereby creating a more uniform distribution of errors within the capabilities of the FEC coding. An FEC inner code may then be applied to each packet for determining (at the receiver) whether the respective has been successfully transmitted and received (S319). The packets of the data stream are then transmitted over the communications channel (S321).

Figure 3B:
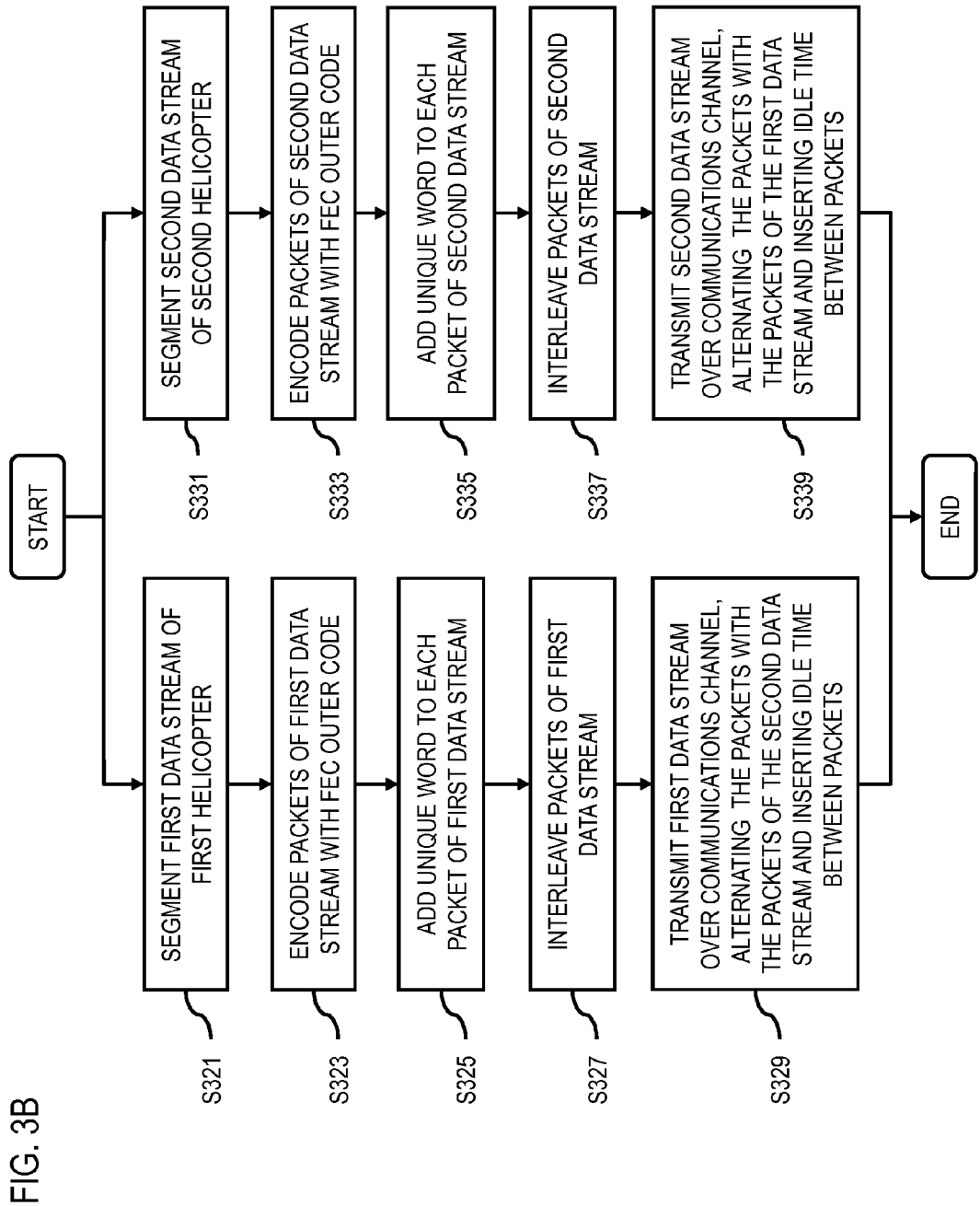
FIG. 3B illustrates a flow chart depicting the process of two data transmissions sharing a channel in a wireless communications system, according to an exemplary embodiment.

Referring to FIG. 3B, according to a further exemplary embodiment, in a situation where two or more helicopters share the same channel or carrier, as with the single helicopter scenario discussed above, the transmission from each helicopter is configured as a burst-mode transmission. Each data stream is segmented into fixed size bursts or packets (S321, S331), an outer forward error correction (FEC) coding is applied (S323, S333), a unique word (UW) is added at the beginning of each packet (S325, S335), and the packets are interleaved (S327, S337). The packets of the first and second data streams are then transmitted over the communications channel, alternating the packets of the first data stream with the packets of the second data stream (S329, S339). As with the single helicopter scenario, an FEC inner code may then be applied to each packet for determining (at the receiver) whether the respective has been successfully transmitted and received. Further, in the multi-helicopter scenario, an idle time is allocated between packets in the data stream as transmitted over the communications channel (S329, S339). Further, depending on the carrier size and the data rate of each transmitted stream from an individual helicopter, it is also possible that not all time slots will be occupied all the time.

According to a further exemplary embodiment, a burst may contain several very short packets, each packet having an individual header and cyclic redundancy check (CRC) bits. A UW would be added to each burst, and each burst would have an idle time preceding it. The UW and idle time are considered burst overhead. In this embodiment, the packaging of several short packets in a single burst reduces overhead, as compared to the single packet per burst approach discussed above. In this approach, even if a burst is partially blocked, as long as the UW is not blocked, the receiver would be able to acquire the carrier frequency, phase and clock from the UW packets, and to then recover the packets of the burst that have not been blocked. According to a further embodiment, the UW may be inserted in the middle of each burst, as the mid-amble. In such a scenario, after detecting the UW, the receiver works backwards from the UW to retrieve the first part of the data, and work forward from the UW to retrieve the data after the UW. This implementation is possible as modern satellite receivers sample the received transmission signal, store the data in memory, and subsequently process the data.

With a mid-amble, bursts partially blocked at the fronted as well as bursts partially blocked at the backend can be partially recovered, maximizing the overall efficiency of the scheme.

Figure 4:
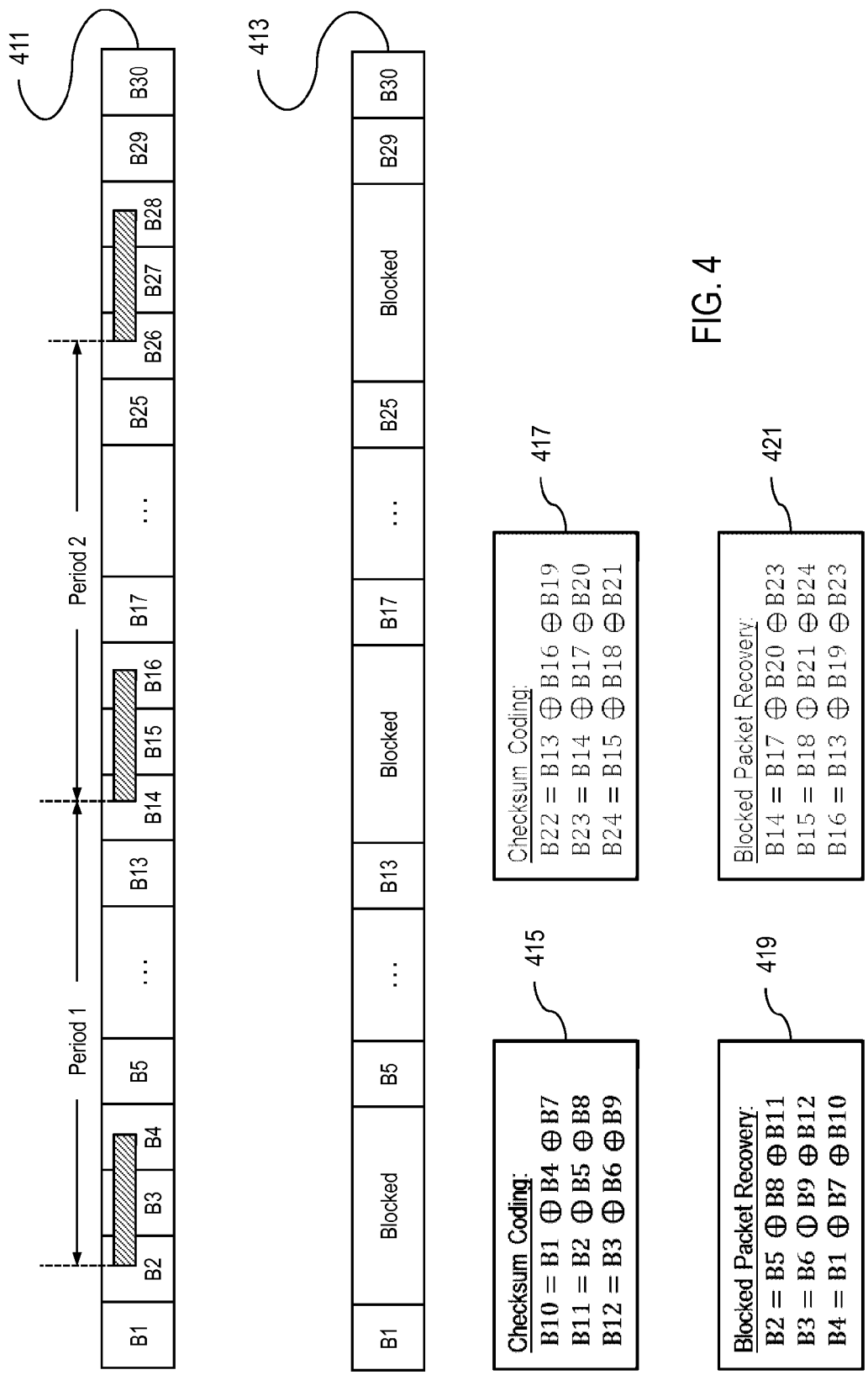
FIG. 4 illustrates an example of a coding scheme for a transmitted data stream that is subject to a periodic blockage, such as from the blades of a helicopter, according to an exemplary embodiment.

FIG. 4 illustrates an example of the coding of a transmitted data stream 411 in view of a periodic blockage, such as from the blades 217 of a helicopter 211. The example of FIG. 4 reflects a blade blockage period of about 12 packets (e.g., Period 1 of packets B2-B13 and period 2 of packets B14-B25, as depicted in FIG. 4), and the blockage duration is about 2 packets in length. In the received data stream 413, while the blockage duration is of a length of only approximately two packets, each passage of a blade causes loss of three consecutive packets (e.g., partial blockage of B2 and B4 and full blockage of B3), followed by 9 blockage free packets (e.g., B5-B13). The interleaving depth, therefore, must be 3, to ensure no more than one blocked packet is reflected by a given checksum packet. Based on the blockage free duration to blockage duration ratio of 9:3 (or 3:1), one checksum packet must be generated for every three data stream packets. Alternatively, for example, if the blockage duration is only 2 packets, the ratio then becomes 5:1, and the interleaving depth is 2, where each checksum packet covers 5 data stream packets. Further, in order to avoid an implementation that is overly marginal, leaving little room for error, the interleaver length may be backed off by one or more packets to provide for a margin for error. In any event, the concept of exemplary embodiments is scalable to virtually any length, which would facilitate data packet recovery where a relatively larger number of packets are interrupted by each blockage duration (e.g., in higher data rate transmission systems).

With respect to the ratio of 3:1, for example, as depicted by the Checksum Coding 415, the first checksum packet would cover packets B1, B4 and B7, and be transmitted as packet B10, the second checksum packet would cover packets B2, B5 and B8, and be transmitted as packet B11, and the third checksum packet would cover packets B3, B6 and B9, and be transmitted as packet B12. This checksum process continues for subsequent blocks of 9 data packets. For example, as depicted by the Checksum Coding 417, the checksum packet B22 would cover packets B13, B16 and B19, checksum packet B23 would cover packets B14, B17 and B20, and checksum packet B24 would cover packets B15, B18 and B21.

Based on this checksum coding, the consecutively blocked packets can then be recovered based on the respective checksum packets. For example, as depicted by the Blocked Packet Recovery 419, data packet B2 can be recovered based on the checksum packet B11 and the associated non-blocked packets B5 and B8, data packet B3 can be recovered based on the checksum packet B12 and the associated non-blocked packets B6 and B9, and data packet B4 can be recovered based on the checksum packet B10 and the associated non-blocked packets B1 and B7. This recovery process then proceeds for subsequent blockage periods. For example, as depicted by the Blocked Packet Recovery 421, data packet B14 can be recovered based on the checksum packet B23 and the associated non-blocked packets B17 and B20, data packet B15 can be recovered based on the checksum packet B24 and the associated non-blocked packets B18 and B21, and data packet B16 can be recovered based on the checksum packet B23 and the associated non-blocked packets B13 and B19.

Moreover, in the multi-helicopter scenario, for example, B1, B2, and B3 are transmitted sequentially by three different helicopters, respectively. Then the burst B4 is transmitted by the first of the three helicopters, and so on. The different helicopters transmit sequentially, at the same data rate. In the case of the 3:1 ratio, however, because only one burst is blocked by the blade for each helicopter during each period, the interleaving is no longer needed. The distribution of the bursts from each helicopter effectively creates a result similar to the interleaving. Depending on the number of helicopters and the blockage free duration to blockage duration ratio, however, interleaving may be required to ensure that the number of blocked packets in a period does not exceed the capabilities of the FEC coding.

Figure 5A:
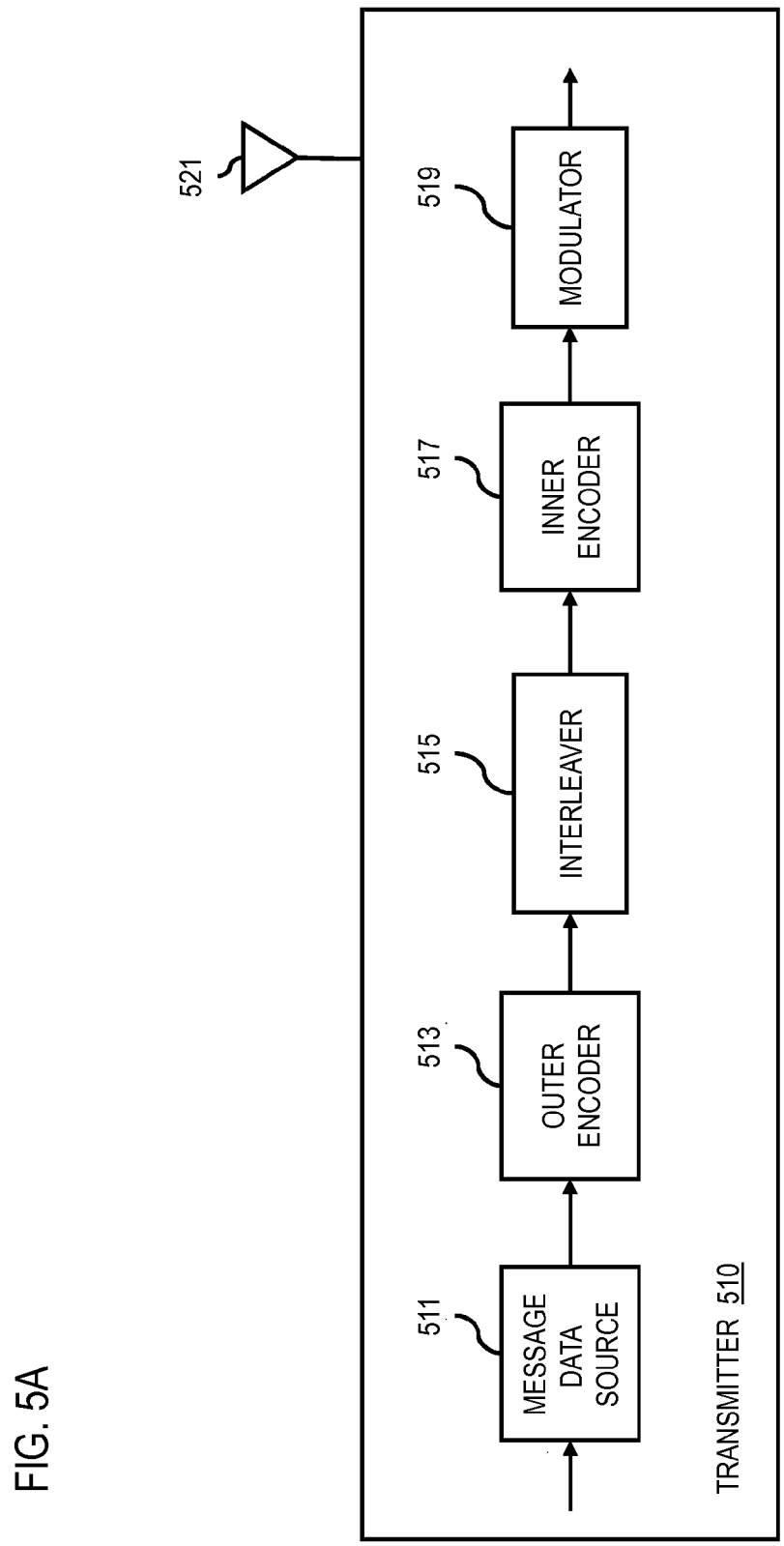
FIG. 5A illustrates a block diagram of an exemplary transmitter configured to operate in the systems of FIGS. 1A and 1B, in accordance with exemplary embodiments.
Figure 5B:
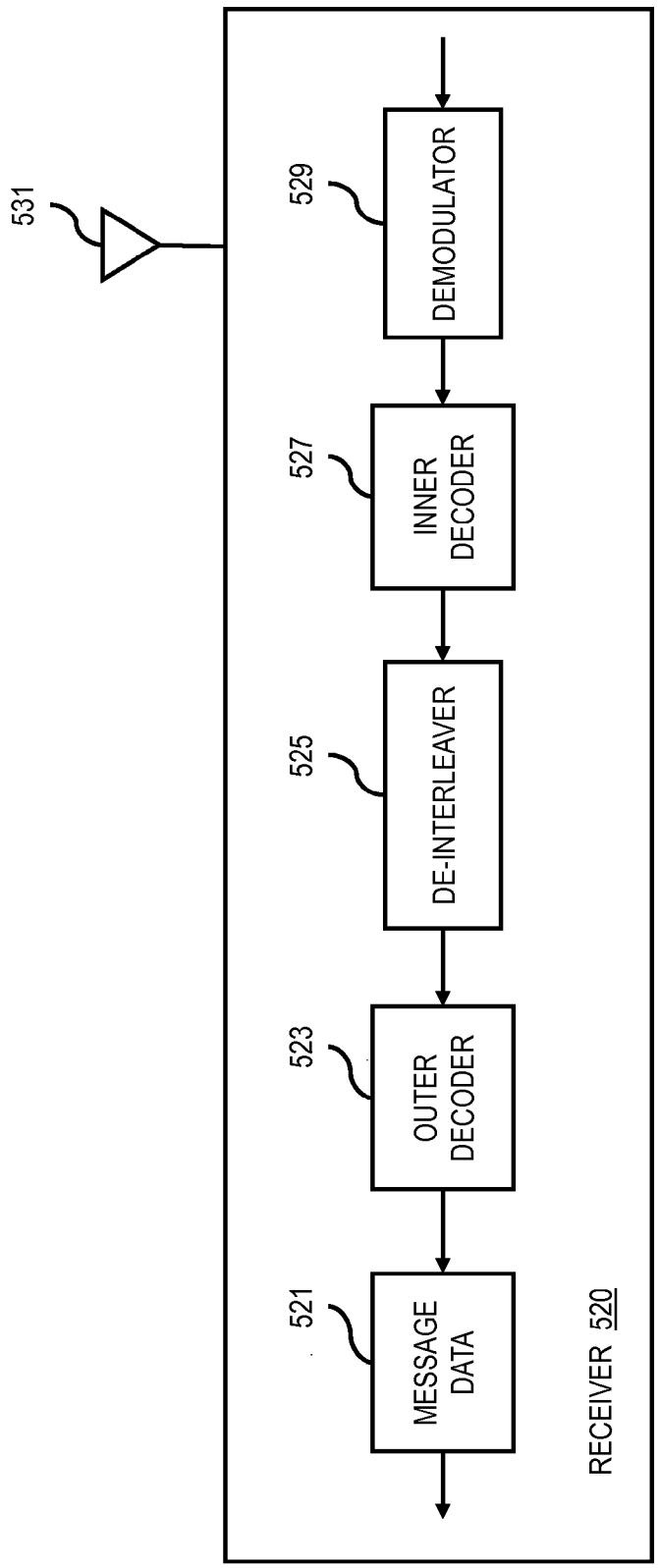
FIG. 5B illustrates a block diagram of an exemplary receiver configured to operate in the systems of FIGS. 1A and 1B, in accordance with exemplary embodiments.

FIG. 5A illustrates a block diagram of an exemplary transmitter 510 configured to operate in the systems of FIGS. 1A and 1B, in accordance with exemplary embodiments of the present invention. FIG. 5B illustrates a block diagram of an exemplary receiver configured to operate in the systems of FIGS. 1A and 1B, in accordance with exemplary embodiments of the present invention. According to a further embodiment, an example of an implementation of a data transmission scheme that accommodates for a periodic short duration blockage of the transmission signal will now be described with reference to the transmitter and receiver of FIGS. 5A and 5B. At the transmitter 510, first the data stream from the data source 511 is segmented into fixed size packets for a burst-mode transmission. The packets are arranged column-by-column, for example, as follows:

| Packet 0 | Packet m | ... | Packet nm |
|---|---|---|---|
| Packet 1 | Packet m + 1 | ... | Packet nm + 1 |
| Packet 2 | Packet m + 2 | ... | Packet nm + 2 |
| ... | ... | | ... |
| Packet m − 1 | Packet 2m − 1 | ... | Packet (n +1)m − 1 |

The outer encoder 513 then applies a single parity check coding is applied as an outer code to the m packets in each column by performing a bit-by-bit exclusive or on every bit of the m packets to obtain a parity check packet, as follows:

| Parity Check Co | Packet 0 | Packet m | ... | Packet nm |
|---|---|---|---|---|
| | Packet 1 | Packet m + 1 | ... | Packet nm + 1 |
| | Packet 2 | Packet m + 2 | ... | Packet nm + 2 |
| | ... | ... | | ... |
| | Packet m − 1 | Packet 2m − 1 | ... | Packet (n + 1)m − 1 |
| ↓ | Parity Packet 0 | Parity Packet 1 | | Parity Packet n |

Next, the interleaver 515 interleaves the packets and the inner encoder 517 encodes each packet with an FEC code as an inner code (e.g., LDPC). The data stream is then modulated via the modulator 519, for transmission via the antenna 521, on a row-by-row basis, as follows:

| LDPC Packet 0 | LDPC Packet m | ... | LDPC Packet nm |
|---|---|---|---|
| LDPC Packet 1 | LDPC Packet m + 1 | ... | LDPC Packet nm + 1 |
| LDPC Packet 2 | LDPC Packet m + 2 | ... | LDPC Packet nm + 2 |
| ... | ... | | ... |
| LDPC Packet m − 1 | LDPC Packet 2m − 1 | ... | LDPC Packet (n + 1)m − 1 |
| LDPC Parity Packet 0 | LDPC Parity Packet 1 | | LDPC Parity Packet n |

At the receiver 520, the transmitted data stream is received via the antenna 531, and the demodulator 529 demodulates the received transmission to retrieve the transmitted data packets. The inner decoder 527 attempts to decode each packet. If the inner code is an LDPC code, the parity check equations of the inner decoder 527 indicate whether a particular packet has been correctly decoded or not. For other kinds of inner codes, such as turbo or convolutional codes, or for the case where there is no inner code, CRC bits can be used to determine whether each packet is successfully received. The de-interleaver 525 de-interleaves the packets to present them to the outer decoder 523 in the original column-by-column order. Unsuccessful packets would then be recovered based on the single parity check coding of the outer code and the associated successfully received packets in the same column as the unsuccessful packet (in other words, the other packets covered by the respective single parity check code packet). As a result, the original message data 521 is recovered from the received transmission.

Accordingly, in view of exemplary embodiments, because the parameters of the channel are well defined and known (e.g., the blockage period and blockage duration are known), the parameters of the interleaver can be set to capture a number of blocked packets that does not exceed the capabilities of the FEC coding. Further, the total number of packets in a row/column interleaver should not exceed the number of packets sent between sequential blockages of the two blades of the helicopter, so that only one blockage event affects the packets in an interleaver block.

As would be recognized by one of ordinary skill in the art, a more powerful outer coding scheme is possible. For example, a more powerful FEC coding can be employed for recovery of more than one lost packet within a number of packets, and thereby reduce the required interleaver length. Such more powerful FEC codes, however, require significantly more complexity and overhead, and thus come at significantly higher costs (in both processing and implementation). Whereas, a single parity check code, such as the checksum coding described above, represent one of the simplest codes from a complexity and overhead standpoint, and the interleaver adds relatively low additional complexity as compared to a more powerful, multi-parity check codes for correction of multiple errors. Furthermore, in view of the fact that the channel impairments due to the periodic blockage of the helicopter blades are discernible, according to exemplary embodiments, this knowledge of the channel is exploited to enable use of a relatively simple outer FEC code and interleaver. Whereas, in cases of thermal noise and other channel impairments, which are generally of an unknown and unpredictable behavior, more complex FEC coding (e.g., turbo codes or LDPC coding) is required for error correction.

Figure 6:
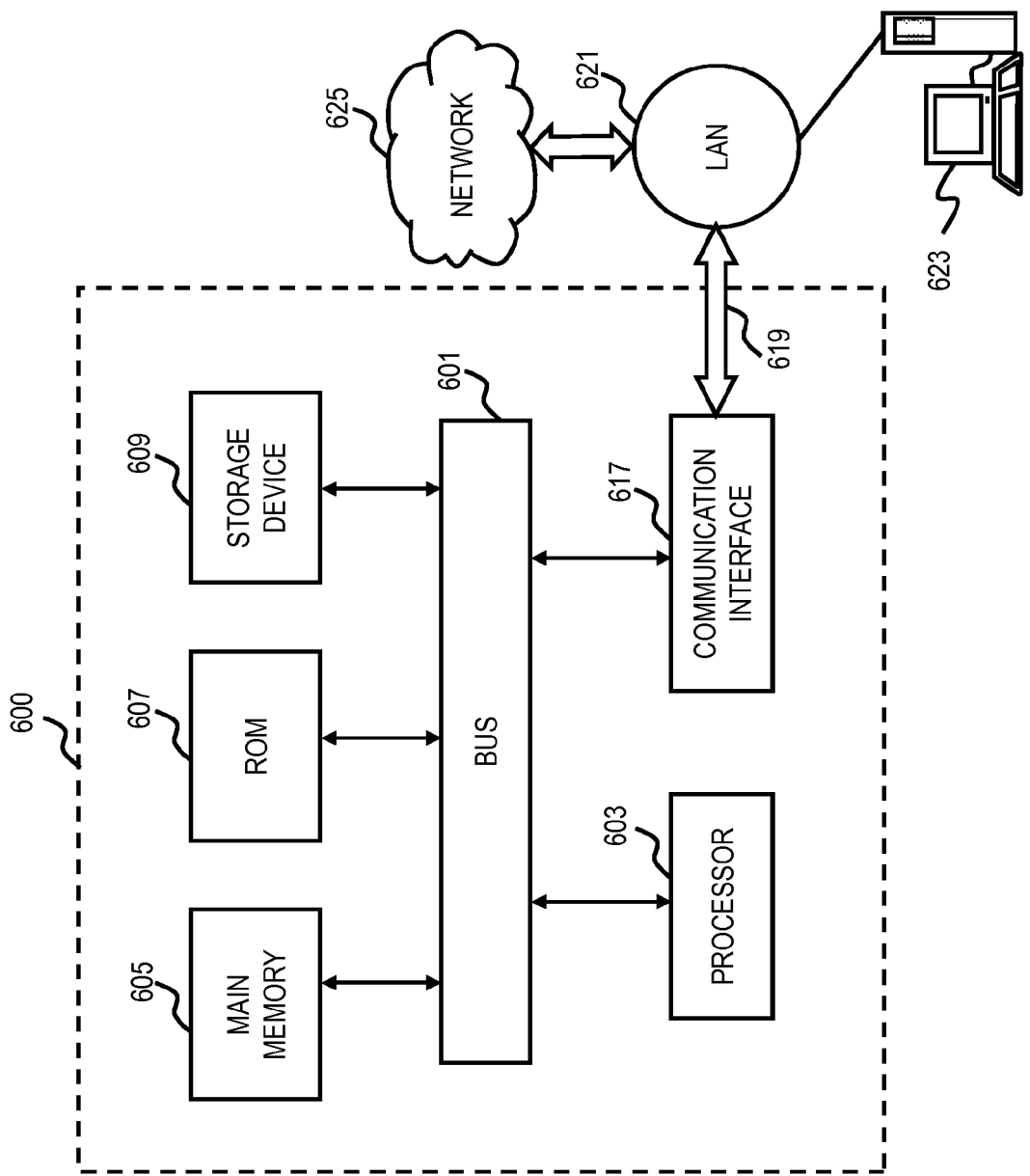
FIG. 6 is a diagram of a computer system that can perform the processes for a parameterized interleaver design, according to exemplary embodiments.

FIG. 6 illustrates a computer system upon which exemplary embodiments according to the present invention can be implemented. The computer system 600 includes a bus 601 or other communication mechanism for communicating information, and a processor 603 coupled to the bus 601 for processing information. The computer system 600 also includes main memory 605, such as a random access memory (RAM) or other dynamic storage device, coupled to the bus 601 for storing information and instructions to be executed by the processor 603. Main memory 605 can also be used for storing temporary variables or other intermediate information during execution of instructions to be executed by the processor 603. The computer system 600 further includes a read only memory (ROM) 607 or other static storage device coupled to the bus 601 for storing static information and instructions for the processor 603. A storage device 609, such as a magnetic disk or optical disk, is additionally coupled to the bus 601 for storing information and instructions.

According to one embodiment of the invention, generation and operation of interleaver designs in accordance with exemplary embodiments is provided by the computer system 600 in response to the processor 603 executing an arrangement of instructions contained in main memory 605. Such instructions can be read into main memory 605 from another computer-readable medium, such as the storage device 609. Execution of the arrangement of instructions contained in main memory 605 causes the processor 603 to perform the process steps described herein. One or more processors in a multi-processing arrangement may also be employed to execute the instructions contained in main memory 605. In alternative embodiments, hard-wired circuitry may be used in place of or in combination with software instructions to implement the embodiment of the present invention. Thus, embodiments of the present invention are not limited to any specific combination of hardware circuitry and software.

The computer system 600 also includes a communication interface 617 coupled to bus 601. The communication interface 617 provides a two-way data communication coupling to a network link 619 connected to a local network 621. For example, the communication interface 617 may be a digital subscriber line (DSL) card or modem, an integrated services digital network (ISDN) card, a cable modem, or a telephone modem to provide a data communication connection to a corresponding type of telephone line. As another example, communication interface 617 may be a local area network (LAN) card (e.g. for Ethernet™ or an Asynchronous Transfer Model (ATM) network) to provide a data communication connection to a compatible LAN. Wireless links can also be implemented. In any such implementation, communication interface 617 sends and receives electrical, electromagnetic, or optical signals that carry digital data streams representing various types of information. Further, the communication interface 617 can include peripheral interface devices, such as a Universal Serial Bus (USB) interface, a PCMCIA (Personal Computer Memory Card International Association) interface, etc.

The network link 619 typically provides data communication through one or more networks to other data devices. For example, the network link 619 may provide a connection through local network 621 to a host computer 623, which has connectivity to a network 625 (e.g. a wide area network (WAN) or the global packet data communication network now commonly referred to as the "Internet") or to data equipment operated by service provider. The local network 621 and network 625 both use electrical, electromagnetic, or optical signals to convey information and instructions. The signals through the various networks and the signals on network link 619 and through communication interface 617, which communicate digital data with computer system 600, are exemplary forms of carrier waves bearing the information and instructions.

The computer system 600 can send messages and receive data, including program code, through the network(s), network link 619, and communication interface 617. In the Internet example, a server (not shown) might transmit requested code belonging to an application program for implementing an embodiment of the present invention through the network 625, local network 621 and communication interface 617. The processor 603 may execute the transmitted code while being received and/or store the code in storage device 239, or other non-volatile storage for later execution. In this manner, computer system 600 may obtain application code in the form of a carrier wave.

The term "computer-readable medium" as used herein refers to any medium that participates in providing instructions to the processor 603 for execution. Such a medium may take many forms, including but not limited to non-volatile media, volatile media, and transmission media. Non-volatile media include, for example, optical or magnetic disks, such as storage device 609. Volatile media include dynamic memory, such as main memory 605. Transmission media include coaxial cables, copper wire and fiber optics, including the wires that comprise bus 601. Transmission media can also take the form of acoustic, optical, or electromagnetic waves, such as those generated during radio frequency (RF) and infrared (IR) data communications. Common forms of computer-readable media include, for example, a floppy disk, a flexible disk, hard disk, magnetic tape, any other magnetic medium, a CD ROM, CDRW, DVD, any other optical medium, punch cards, paper tape, optical mark sheets, any other physical medium with patterns of holes or other optically recognizable indicia, a RAM, a PROM, and EPROM, a FLASH EPROM, any other memory chip or cartridge, a carrier wave, or any other medium from which a computer can read.

Various forms of computer-readable media may be involved in providing instructions to a processor for execution. For example, the instructions for carrying out at least part of the present invention may initially be borne on a magnetic disk of a remote computer. In such a scenario, the remote computer loads the instructions into main memory and sends the instructions over a telephone line using a modem. A modem of a local computer system receives the data on the telephone line and uses an infrared transmitter to convert the data to an infrared signal and transmit the infrared signal to a portable computing device, such as a personal digital assistance (PDA) and a laptop. An infrared detector on the portable computing device receives the information and instructions borne by the infrared signal and places the data on a bus. The bus conveys the data to main memory, from which a processor retrieves and executes the instructions. The instructions received by main memory may optionally be stored on storage device either before or after execution by processor.

Figure 7:
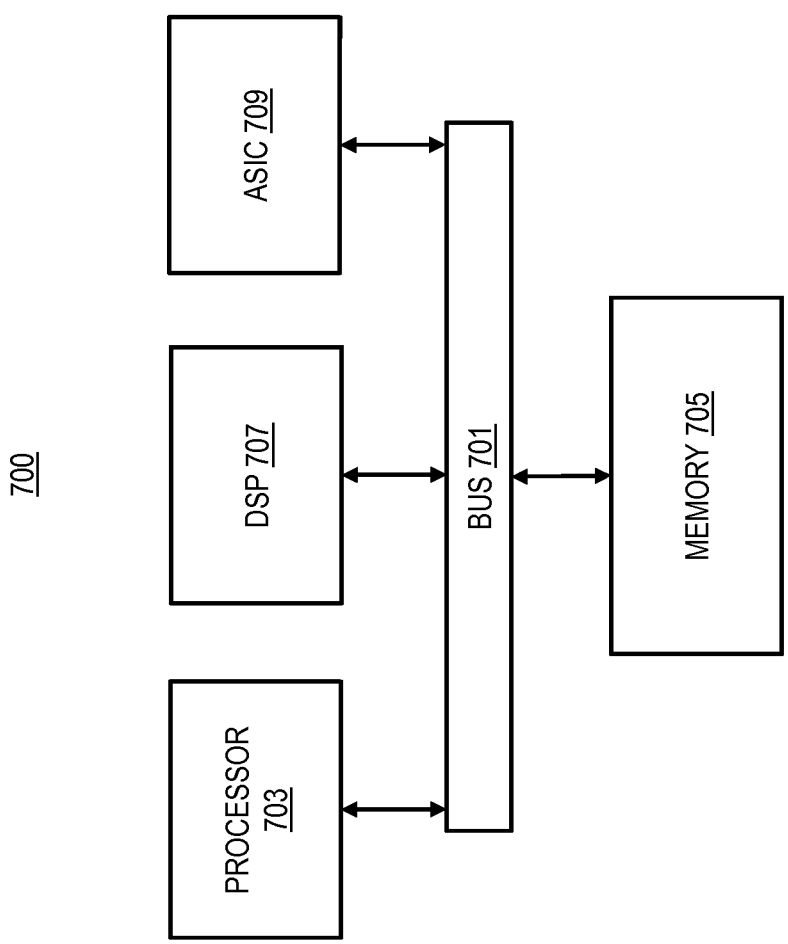
FIG. 7 is a diagram of a chip set that can be used to implement exemplary embodiments.

FIG. 7 illustrates a chip set 700 in which embodiments of the invention may be implemented. Chip set 700 includes, for instance, processor and memory components described with respect to FIG. 7 incorporated in one or more physical packages. By way of example, a physical package includes an arrangement of one or more materials, components, and/or wires on a structural assembly (e.g., a baseboard) to provide one or more characteristics such as physical strength, conservation of size, and/or limitation of electrical interaction.

In one embodiment, the chip set 700 includes a communication mechanism such as a bus 701 for passing information among the components of the chip set 700. A processor 703 has connectivity to the bus 701 to execute instructions and process information stored in, for example, a memory 705. The processor 703 may include one or more processing cores with each core configured to perform independently. A multi-core processor enables multiprocessing within a single physical package. Examples of a multi-core processor include two, four, eight, or greater numbers of processing cores. Alternatively or in addition, the processor 703 may include one or more microprocessors configured in tandem via the bus 701 to enable independent execution of instructions, pipelining, and multithreading. The processor 703 may also be accompanied with one or more specialized components to perform certain processing functions and tasks such as one or more digital signal processors (DSP) 707, and/or one or more application-specific integrated circuits (ASIC) 709. A DSP 707 typically is configured to process real-world signals (e.g., sound) in real time independently of the processor 703. Similarly, an ASIC 709 can be configured to performed specialized functions not easily performed by a general purposed processor. Other specialized components to aid in performing the inventive functions described herein include one or more field programmable gate arrays (FPGA) (not shown), one or more controllers (not shown), or one or more other special-purpose computer chips.

The processor 703 and accompanying components have connectivity to the memory 705 via the bus 701. The memory 705 includes both dynamic memory (e.g., RAM) and static memory (e.g., ROM) for storing executable instructions that, when executed by the processor 703 and/or the DSP 707 and/or the ASIC 709, perform the process of exemplary embodiments as described herein. The memory 705 also stores the data associated with or generated by the execution of the process.

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

What is claimed is:

1. A method, comprising:
segmenting a first data stream into packets of a predetermined fixed-size for a burst-mode transmission over a wireless channel, wherein the transmission is subject to a first periodic blockage, wherein, for a given duration of time, the first periodic blockage comprises a recurring blockage of a given duration occurring at a period of regular intervals;
applying a forward error correction (FEC) outer code to the packets of the first data stream for recovery of packets subjected to the first periodic blockage, wherein the application of the FEC outer code comprises grouping the packets of the first data stream into a plurality of groups of n packets in each group and applying an error correction code to each group of packets, wherein the grouping of the packets comprises interleaving the packets of the first data stream so that each group contains a number of packets subjected to the first periodic blockage that does not exceed the error correction capabilities of the error correction code applied to the group, and wherein the number of packets n in each group of packets of the first data stream is based on one or more of the period of the recurring blockage and the blockage duration of the first periodic blockage; and
transmitting the first data stream over the wireless channel.

2. The method of claim 1, further comprising:
adding a unique word (UW) to each of the packets of the first data stream for acquisition one or more of a frequency, carrier phase and symbol timing of the respective packet.

3. The method of claim 1, further comprising:
applying a forward error correction (FEC) inner code to each packet of the first data stream.

4. The method of claim 3, wherein the FEC inner code comprises one of a low density parity check code (LDPC), a convolutional code, and a turbo code.

5. The method of claim 1, wherein the predetermined fixed size of the packets reflects a duration that is less than the blockage duration of the first periodic blockage, and is set to optimize efficiency of the transmission over the wireless channel.

6. The method of claim 5, wherein the predetermined fixed size of the packets is set to reflect a duration of approximately one-half of the blockage duration of the first periodic blockage.

7. The method of claim 1, wherein the FEC outer code comprises a single parity check code configured for recovery of the packets of each group of packets of the first data stream subjected to the first periodic blockage.

8. The method of claim 7, wherein the FEC outer code comprises a checksum packet applied to each group of n packets of the first data stream, wherein the interleaving is configured to ensure that no more than one blocked packet is included in each group of packets of the first data stream reflected by a respective checksum packet.

9. The method of claim 1, wherein the packets of the first data stream are interleaved based on an interleaver of a depth based at least in part on a ratio of a blockage free duration between two consecutive blockages of the first periodic blockage to the blockage duration.

10. The method of claim 1, wherein the FEC outer code comprises a single parity check code configured for recovery of the packets of each group of packest of the first data stream subjected to the first periodic blockage.

11. The method of claim 10, wherein the FEC outer code comprises a checksum packet applied to each group of n packets of the first data stream, wherein the interleaving is configured to ensure that no more than one blocked packet is included in each group of packets of the first data stream reflected by a respective checksum packet.

12. The method of claim 1, wherein:
the wireless channel comprises a channel in a satellite communications system;
the transmission comprises a data transmission of a satellite terminal installed on a helicopter; and
the first periodic blockage comprises periodic blockages from rotor blades of the helicopter.

13. The method of claim 1, further comprising:
segmenting a second data stream into packets of the predetermined fixed-size for a burst-mode transmission over the wireless channel, wherein the transmission is subject to a second periodic blockage, wherein, for a given duration of time, the second periodic blockage comprises a recurring blockage of a given duration occurring at a period of regular intervals;
applying the FEC outer code to the packets of the second data stream for recovery of packets subjected to the second periodic blockage, wherein the application of the FEC outer code comprises grouping the packets of the second data stream into a plurality of groups of n packets in each group and applying an error correction code to each group of packets, wherein the grouping of the packets comprises interleaving the packets of the second data stream so that each group contains a number of packets subjected to the second periodic blockage that does not exceed the error correction capabilities of the error correction code applied to the group, and wherein the number of packets n in each group of packets of the second data stream is based on one or more of the period of the recurring blockage and the blockage duration of the second periodic blockage; and
transmitting the second data stream over the wireless channel with the first data stream, wherein the packets of the second data stream are alternated with the packets of the first data stream, and an idle time is inserted between each of the transmitted packets.

14. The method of claim 13, further comprising:
adding a unique word (UW) to each of the packets of the second data stream for acquisition one or more of a frequency, carrier phase and symbol timing of the respective packet.

15. The method of claim 13, further comprising:
applying a forward error correction (FEC) inner code to each packet of the second data stream.

16. The method of claim 15, wherein the FEC inner code comprises one of a low density parity check code (LDPC), a convolutional code, and a turbo code.

17. The method of claim 13, wherein the packets of the second data stream are interleaved based on an interleaver of a depth based at least in part on a ratio of a blockage free duration between two consecutive blockages of the second periodic blockage to the blockage duration.

18. The method of claim 13, wherein:
the wireless channel comprises a channel in a satellite communications system;
the transmission of the first data stream comprises a data transmission of a first satellite terminal installed on a first helicopter;
the first periodic blockage comprises periodic blockages from rotor blades of the first helicopter;
the transmission of the second data stream comprises a data transmission of a second satellite terminal installed on a second helicopter; and
the second periodic blockage comprises periodic blockages from rotor blades of the second helicopter.

19. The method of claim 1, wherein the packets of the first data stream comprise multiple sub-packets, wherein each sub-packet includes a header and cyclic redundancy check (CRC) bits.

20. An apparatus, comprising:
at least one processor; and
at least one memory including computer program code for one or more programs,
the at least one memory and the computer program code configured to, with the at least one processor, cause the apparatus to perform at least the following,
segment a first data stream into packets of a predetermined fixed-size for a burst-mode transmission over a wireless channel, wherein the transmission is subject to a first periodic blockage, wherein, for a given duration of time, the first periodic blockage comprises a recurring blockage of a given duration occurring at a period of regular intervals;
apply a forward error correction (FEC) outer code to the packets of the first data stream for recovery of packets subjected to the first periodic blockage, wherein the application of the FEC outer code comprises grouping the packets of the first data stream into a plurality of groups of n packets in each group and applying an error correction code to each group of packets, wherein the grouping of the packets comprises interleaving the packets of the first data stream so that each group contains a number of packets subjected to the first periodic blockage that does not exceed the error correction capabilities of the error correction code applied to the group, and wherein the number of packets n in each group of packets of the first data stream is based on one or more of the period of the recurring blockage and the blockage duration of the first periodic blockage; and
transmit the first data stream over the wireless channel.

21. The apparatus of claim 20, wherein the apparatus is further caused to:
add a unique word (UW) to each of the packets of the first data stream for acquisition one or more of a frequency, carrier phase and symbol timing of the respective packet.

22. The apparatus of claim 20, wherein the apparatus is further caused to:
apply a forward error correction (FEC) inner code to each packet of the first data stream for determining whether the packet has been successfully transmitted.

23. The method of claim 22, wherein the FEC inner code comprises one of a low density parity check code (LDPC), a convolutional code, and a turbo code.

24. The apparatus of claim 20, wherein the predetermined fixed size of the packets reflects a duration that is less than the blockage duration of the first periodic blockage, and is set to optimize efficiency of the transmission over the wireless channel.

25. The apparatus of claim 24, wherein the predetermined fixed size of the packets is set to reflect a duration of approximately one-half of the blockage duration of the first periodic blockage.

26. The apparatus of claim 20, wherein the FEC outer code comprises a single parity check code configured for recovery of the packets of each group of packets of the first data stream subjected to the first periodic blockage.

27. The apparatus of claim 26, wherein the FEC outer code comprises a checksum packet applied to each group of n packets of the first data stream, wherein the interleaving is configured to ensure that no more than one blocked packet is included in each group of packets of the first data stream reflected by a respective checksum packet.

28. The apparatus of claim 20, wherein the packets of the first data stream are interleaved based on an interleaver of a depth based at least in part on a ratio of a blockage free duration between two consecutive blockages of the first periodic blockage to the blockage duration.

29. The apparatus of claim 20, wherein the FEC outer code comprises a single parity check code configured for recovery of the packets of each group of packest of the first data stream subjected to the first periodic blockage.

30. The apparatus of claim 20, wherein the FEC outer code comprises a checksum packet applied to each group of n packets of the first data stream, wherein the interleaving is configured to ensure that no more than one blocked packet is included in each group of packets of the first data stream reflected by a respective checksum packet.

31. The apparatus of claim 20, wherein:
the wireless channel comprises a channel in a satellite communications system;
the apparatus is installed on a helicopter, and the transmission comprises a satellite data transmission of the apparatus; and
the first periodic blockage comprises periodic blockages from rotor blades of the helicopter.

32. The apparatus of claim 20, wherein the packets of the first data stream comprise multiple sub-packets, wherein each sub-packet includes a header and cyclic redundancy check (CRC) bits.

33. A computer-readable storage medium carrying one or more sequences of one or more instructions which, when executed by one or more processors, cause an apparatus to at least perform the following steps:
segmenting a first data stream into packets of a predetermined fixed-size for a burst-mode transmission over a wireless channel, wherein the transmission is subject to a first periodic blockage, wherein, for a given duration of time, the first periodic blockage comprises a recurring blockage of a given duration occurring at a period of regular intervals;
applying a forward error correction (FEC) outer code to the packets of the first data stream for recovery of packets subjected to the first periodic blockage, wherein the application of the FEC outer code comprises grouping the packets of the first data stream into a plurality of groups of n packets in each group and applying an error correction code to each group of packets, wherein the grouping of the packets comprises interleaving the packets of the first data stream so that each group contains a number of packets subjected to the first periodic blockage that does not exceed the error correction capabilities of the error correction code applied to the group, and wherein the number of packets n in each group of packets of the first data stream is based on one or more of the period of the recurring blockage and the blockage duration of the first periodic blockage;
adding a unique word (UW) to each of the packets of the first data stream for acquisition one or more of a frequency, carrier phase and symbol timing of the respective packet; and
transmitting the first data stream over the wireless channel.

* * * * *